United States Patent
Bauch et al.

(10) Patent No.: US 7,084,962 B2
(45) Date of Patent: Aug. 1, 2006

(54) METHOD FOR DETECTING POSITIONING ERRORS OF CIRCUIT PATTERNS DURING THE TRANSFER BY MEANS OF A MASK INTO LAYERS OF A SUBSTRATE OF A SEMICONDUCTOR WAFER

(75) Inventors: Lothar Bauch, Dresden (DE); Stefan Gruss, Dresden (DE); Ansgar Teipel, Dresden (DE); Hans-Georg Froehlich, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/951,661

(22) Filed: Sep. 29, 2004

(65) Prior Publication Data

US 2005/0068515 A1    Mar. 31, 2005

(30) Foreign Application Priority Data

Sep. 30, 2003    (DE) ............................... 103 45 466

(51) Int. Cl.
  *G03B 27/32* (2006.01)
  *G03B 27/52* (2006.01)

(52) U.S. Cl. .......................... 355/77; 355/55

(58) Field of Classification Search .................. 355/52, 355/53, 55, 77; 430/5, 22, 311; 356/399–401; 250/548; 438/14
See application file for complete search history.

(56) References Cited

U.S. PATENT DOCUMENTS

| | | | | |
|---|---|---|---|---|
| 5,451,479 A | * | 9/1995 | Ishibashi | 430/22 |
| 5,601,957 A | * | 2/1997 | Mizutani et al. | 430/22 |
| 5,966,201 A | * | 10/1999 | Shiraishi et al. | 355/53 |
| 6,610,448 B1 | | 8/2003 | Sato et al. | |
| 6,639,677 B1 | * | 10/2003 | Ina et al. | 356/401 |
| 6,908,775 B1 | * | 6/2005 | Heine et al. | 438/14 |

* cited by examiner

*Primary Examiner*—Henry Hung Nguyen
(74) *Attorney, Agent, or Firm*—Edell, Shapiro & Finnan, LLC

(57) ABSTRACT

A method, suitable to photolithographie projection, for detecting the positioning errors of circuit patterns during the transfer by a mask into layers of a substrate of a semiconductor wafer. After the transfer of at least one multiple arrangement of a first test structure into at least one resist layer above the substrate, wherein the first test structure includes a first circuit pattern, at least one first overlay mark and at least one first micropatterned alignment mark, the values of a first positioning error of the first circuit patterns relative to the first overlay marks and the first micropatterned alignment marks are determined for each element of the at least one multiple arrangement.

17 Claims, 3 Drawing Sheets

METHOD FOR DETECTING POSITIONING ERRORS OF CIRCUIT PATTERNS DURING THE TRANSFER BY MEANS OF A MASK INTO LAYERS OF A SUBSTRATE OF A SEMICONDUCTOR WAFER

CROSS REFERENCE TO RELATED APPLICATIONS

This application claims priority under 35 USC §119 to German Application No. DE 10345466.7, filed on Sep. 30, 2003, and titled "Method for Detecting Positioning Errors of Circuit Patterns During the Transfer by Means of a Mask into Layers of a Substrate of a Semiconductor Wafer," the entire contents of which are hereby incorporated by reference.

FIELD OF THE INVENTION

The present invention relates to a method for detecting positioning errors of circuit patterns during the transfer by a mask into layers of a substrate of a semiconductor wafer.

BACKGROUND

In order to fabricate integrated circuits, layers provided with different electrical properties are usually applied to semiconductor substrates (wafers) and patterned lithographically. Lithographic patterning may include applying a photosensitive resist, exposing the resist with a desired structure for the relevant plane, developing it, and then transferring the resist mask into the underlying layer in an etching step.

As the integration densities of integrated circuits continually increase, there is also an increase in the requirements made of the positional accuracy of a structure to be projected onto the semiconductor substrate. Particularly when prior planes have already been transferred into underlying layers, e.g., in a lithographic projection step, it is necessary to account for stricter tolerance limits with regard to the reciprocal orientation of the structure that is currently to be projected onto the substrate relative to the structures of the aforementioned prior planes, in order to ensure the functionality of the circuit.

Therefore, before the start of the respective exposures, alignment sequences are provided for the lithographic projection step, which may be performed, e.g., in a wafer stepper or scanner. The alignment marks are typically arranged in the edge regions of the masks providing the relevant structure. During the exposure, the alignment marks are transferred in the sawing kerf that separates the individual exposure fields on the wafer. The alignment marks make it possible to determine the position of the structures formed on the wafer or, by determining the positioning of the alignment marks, it is possible to deduce the precise positioning and orientation of the structure for the integrated circuit.

The orientation or alignment of the substrate in the exposure device with respect to the projection optics (i.e., the projection lenses, the mask that is to be projected in each case, diaphragms and also the illumination source, etc.) is carried out by comparing the alignment marks with reference marks. Such reference marks are often inserted via the lens system with respect to a detector.

The way in which the alignment method is specifically carried out depends on the device manufacturers. An offset of the actual alignment mark position with respect to the ideal position of the reference mark is ascertained on the basis of the mark comparison. Consequently, the wafer that is generally deposited onto a substrate holder can be corrected in terms of its position, so that the subsequent exposure can be performed with high positional accuracy.

A problem to which little consideration has been given hitherto in this context is proposed by the differing degree of positional accuracy of different structure pattern proportions that can be achieved within an exposure field. Reasons for this are, in particular, lens imaging errors such as, for example, the distortions called coma, three-leaf clover, astigmatism, etc., and are generally referred to as aberration errors.

Furthermore, process influences lead to a deviation of the alignment mark from the ideal position, which may arise, for example, during chemical mechanical polishing or metal deposition in a sputtering installation.

An effect that is to be emphasized as particularly problematic here is that the size of the imaging error of a structure depends on the respective form, orientation and size of the structure. It thus happens that, for example, dense line/gap structures having very small structure dimensions are provided with a different offset with respect to an ideal position during an exposure with a perfect lens than for example the alignment marks that generally have very large dimensions.

In such cases, the abovementioned conclusion of the positions of the respectively imaged structures drawn from the position determined for the alignment mark during alignment may be beset by errors. This is more applicable as the structures or structure elements differ in size, form, and orientation from the alignment marks.

Most device manufacturers embody alignment marks as arrangements of elongate, parallel bars. Such bars are nowadays usually embodied with structure widths of more than 1 µm. Dense line/gap patterns such as are formed, for instance, in the area of fabrication of random access memories (DRAM) have line widths of 70, 90, or 110 nm.

In the area of alignment methods, i.e., during alignment of a wafer in the exposure device, for two successively exposed planes on a test substrate, a first offset is measured between a first and second overlay measurement mark of the two planes and a second offset is measured between a first and a second element of structures of the respective planes. The two elements have a width near to the resolution limit of the exposure device. The two elements are thus subject to a different imaging error on account of lens distortions and the measurement marks. The offset between the first and second offsets is determined by an optical measurement method and added as correction for the exposure position determined by alignment mark comparison during the alignment of a substrate that is subsequently to be exposed, so that the two structures, instead of the alignment or overlay measurement marks, are aligned with one another with high accuracy.

In this case, however, determining the positional accuracy error by test exposures necessitates the production of a plurality of special test substrates which permit a determination of the positional inaccuracies for two layers laying one above the other. As a result, the determination of the positional inaccuracies for the layers of the integrated circuit is very time-consuming, particularly when evaluating a new process line.

A method for simply determining of the positioning errors for each layer for an integrated circuit having one layer or having a plurality of layers is desirable.

SUMMARY

A method for detecting positioning errors of circuit patterns during the transfer by a mask into layers of a substrate of a semiconductor wafer includes providing a semiconductor wafer with a substrate; transferring at least one multiple arrangement of a first test structure by photolithographic projection into at least one resist layer above the substrate, the first test structure having a first circuit pattern, at least one first overlay mark and at least one first micropatterned alignment mark; and determination of the values of a first positioning error of the first circuit pattern relative to the first overlap marks and the first micropatterned alignment marks for each element of the at least one multiple arrangement.

The method according to the invention enables a simple determination of the positioning errors of circuit patterns since the overlay marks and micropattern alignment marks are embodied in the form of one or a plurality of bars which generate a high-contrast pattern during an optical measurement. Since the overlay marks and the circuit patterns are transferred into the second layer of a substrate of a semiconductor wafer, it is possible to determine the positioning errors composed of positional inaccuracy errors of the overlay marks, the micropatterned alignment marks and the circuit patterns, for example, during the evaluation of a new process line, in a manner dependent on different forms used of overlay marks, micropatterned alignment marks and circuit patterns, but also on different projection apparatuses or embodiments of marks, over a large region of the substrate.

In a further embodiment, at least one multiple arrangement of a second test structure is transferred by photolithographic projection into at least one resist layer above the substrate. The second test structure has a second circuit pattern, at least one second overlay mark, which can be used together with the first overlay mark for alignment of the semiconductor wafer during the exposure, and at least one second micropatterned alignment mark. Values of a second positioning error of the second circuit patterns relative to the second overlay marks and the second micropatterned alignment marks are determined for each element of the at least one multiple arrangement. The relative positioning error of the first layer and the second layer is determined from the first positioning error and the second positioning error.

Based on procedure, in addition to the abovementioned first positioning error, it is also possible to determine a second positioning error that can likewise be detected in a manner dependent on differently formed second overlay marks, second micropatterned alignment marks, and second circuit patterns using different projection apparatuses over a large region of the substrate.

In a further embodiment, the multiple arrangement of the first test structure and the multiple arrangement of the second test structure are arranged in column-type fashion, so that, during a transfer of the structure into the substrate by a projection apparatus with an exposure slot, it is possible to determine the first positioning errors, the second positioning errors, and the relative positioning errors of the test structures along an exposure slot of the projection apparatus.

Based on this procedure, it is possible to arrange the elements of the multiple arrangement along an exposure slot of the projection apparatus, so that it is possible to determine the first positioning errors, second positioning errors, and relative positioning errors of the test structures as correction for locally different imaging errors during the transfer with a wafer scanner as projection apparatus.

In a further embodiment, the multiple arrangement of the first test structure and the multiple arrangement of the second test structure are arranged in matrix-type fashion, so that, during a transfer of the structure into the substrate by a projection apparatus with a lens, it is possible to determine the first positioning errors, the second positioning errors, and the relative positioning errors of the test structures in the imaging region of a lens of the projection apparatus.

Based on this procedure, it is possible to arrange the elements of the multiple arrangement of the test structures in the imaging region of a lens of the projection apparatus, so that it is possible to determine the first positioning errors, second positioning errors, and relative positioning errors of the test structures as correction for locally different imaging errors during the transfer with a wafer stepper as projection apparatus.

In a further embodiment, the first micropatterned alignment mark is formed with a plurality of microstructure elements, so that the patterning of the first micropatterned alignment mark corresponds to the patterning of the first circuit pattern, and/or the second micropatterned alignment mark is formed with a plurality of microstructure elements, so that the patterning of the second micropatterned alignment mark corresponds to the patterning of the second circuit patterns.

Based on this procedure, it is possible to determine structure-size-dependent positional inaccuracy values of the micropatterned alignment marks, which can be used for determining the first positioning errors and second positioning errors of the circuit patterns.

In a further embodiment, the circuit patterns are formed with densely packed structures, semi-densely packed structures or isolated structures.

Based on this procedure, it is possible to determine the positioning error of circuit patterns that often occur in the fabrication of integrated circuits, such as, e.g., of random access memories (DRAM).

In a further embodiment, a measurement array for scanning electron microscopy is arranged for at least one element of the multiple arrangement of the first test structure. A measurement of the first positioning error in the measurement array is made. A measurement array for scanning electron microscopy can be arranged for at least one element of the multiple arrangement of the second test structure. A measurement of the second positioning error in the measurement array is made.

Based on this procedure, the positioning errors may be determined using a scanning electron microscope. This permits an efficient detection of the relative positioning error, which may be determined, for example, with an automatic conditioning of the measurement data of the scanning electron microscope.

In a further embodiment, the first test structure and the second test structure are transferred into the same resist layer on the substrate by double exposure.

Based on this procedure, the relative positioning error can be determined relatively simply since an overall structure results which, as a superposition of the first test structure and the second test structure, effects a relatively simple possibility for detecting the positioning error.

In a further embodiment, the first test structure is transferred into an oxide layer by the resist layer, and it is furthermore possible for the second test structure to be transferred into a resist layer above oxide layer.

Based on this procedure, it is possible to determine the first positioning errors, second positioning errors, and relative positioning errors of the test structures based on a layer sequence on the substrate of the semiconductor wafer that often occurs in the fabrication of integrated circuits.

In a further embodiment, transfer by the mask in the projection apparatus can be carried out by dipole exposure, quadrupole exposure, or annular exposure.

Based on this procedure, it is possible to determine the first positioning errors, second positioning errors, and relative positioning errors of the test structures based on different exposure modes or different projection apparatuses in order, for example, to be able to detect the contribution thereof to the positioning errors.

In a further embodiment, an alternating phase mask, a halftone phase mask, a COG mask, or a CPL mask can be used as the mask.

Based on this procedure, it is possible to determine the first positioning errors, second positioning errors, and relative positioning errors of the test structures based on different mask types in order, for example, to be able to detect the contribution thereof to the positioning errors.

BRIEF DESCRIPTION OF THE DRAWINGS

The invention will now be explained in more detail on the basis of an exemplary embodiment with the aid of a drawing in which.

DETAILED DESCRIPTION

Figure 1A:
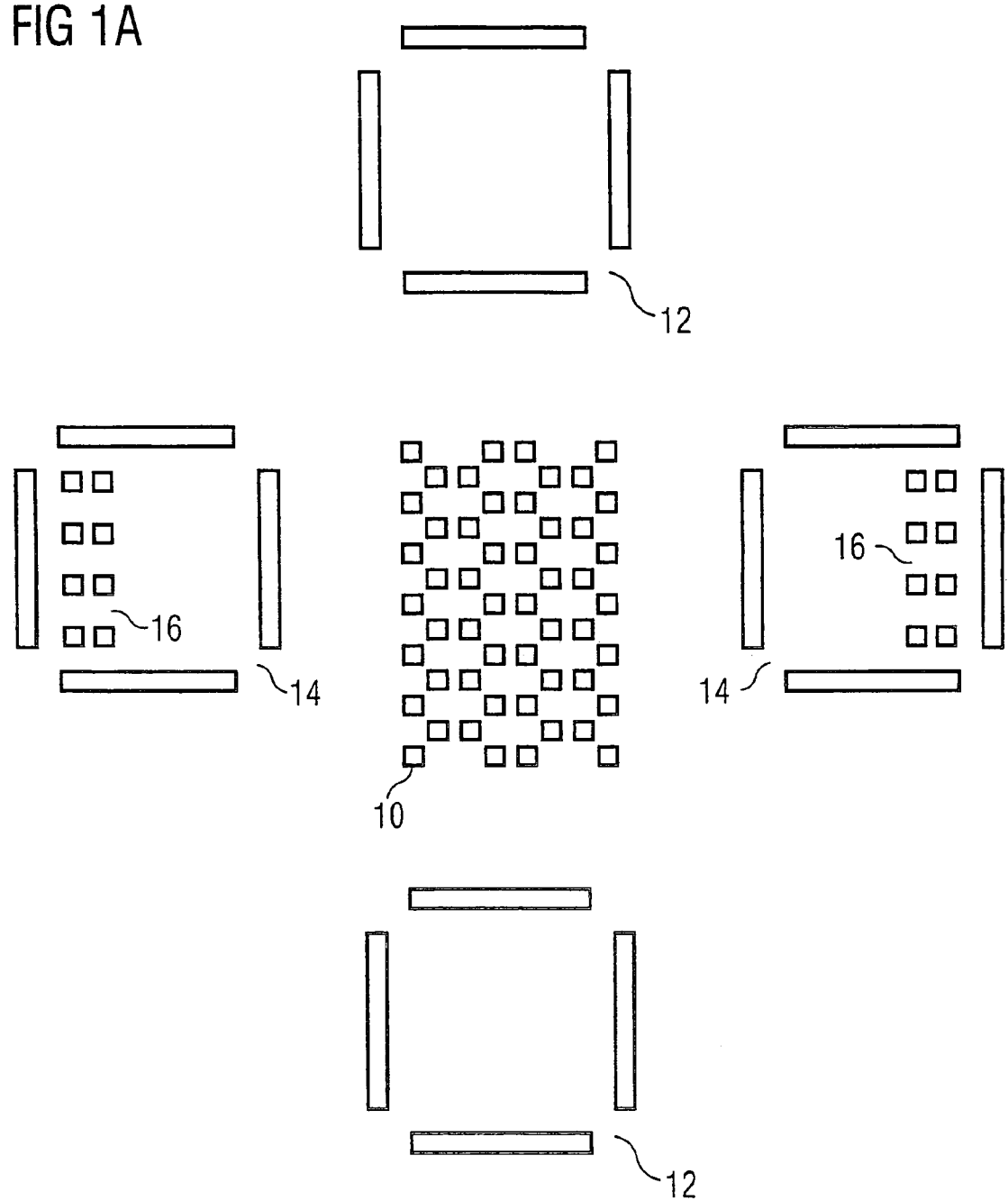
FIG. 1A diagrammatically shows a plan view of a first test structure arrangement which arises through application of an embodiment of the method according to the invention.

FIG. 1A shows an element of a multiple arrangement of a first test structure, which is transferred into a resist layer of a substrate of a semiconductor wafer by photolithographic projection by the method according to the invention using a mask. The first test structure includes a first circuit pattern 10, a first overlay mark 12, and a first micropatterned alignment mark 14.

In this exemplary embodiment, the circuit pattern 10 of the first partial structure is a structure with square or rectangular structure elements that are required, for example, for fabricating deep trenches of a trench capacitor for a random access memory (DRAM). However, the circuit pattern 10 of the first partial structure may also be in the form of a contact hole plane with relatively circular structure elements or as a dense line/gap pattern of a connection plane, for example. Circuit patterns having line widths of 70, 90, or 110 nm, for example, are used, for example, in the fabrication of DRAM memory chips.

A first overlay mark 12 is respectively arranged at the upper and lower edge of the test structure. In this example, the overlay marks 12 are an arrangement of elongate bars, i.e., four bars arranged symmetrically about a midpoint in order to form a rectangular region that is at least partially enclosed by the bars. Usually, bars of such overlay marks 12 have a length of approximately 50 μm to 100 μm and a width of 0.5 μm to 5 μm.

Furthermore, a first micropatterned alignment mark 14 is transferred into the resist layer of the first layer of the substrate. The first micropatterned alignment mark 14 includes, for example, an arrangement of elongate bars that are arranged at the upper and lower edge of the test structure and have similar dimensions to the bars of the first overlay mark. Micropatterned elements 16 may be arranged within the region enclosed by the four bars. The elements have a pattern that corresponds to the first circuit pattern with regard to the structure widths and structure spacings.

Next, values of a first positioning error are determined for each element of the multiple arrangement of the first partial structure. The first positioning error is the positional inaccuracies of the first circuit patterns 10 relative to the first overlay marks 12 and to the first micropatterned alignment marks 14.

Then, a multiple arrangement of a second test structure is transferred by photolithographic projection into a layer above the substrate. In this case, the second test structure is transferred into a region of the substrate in which the first partial structure has been transferred previously, so that the first test structure and the second test structure are arranged in a manner lying one above the other.

Transferring the second test structure into the region of the substrate is achieved because the first test structure and the second test structure are transferred into the same resist layer on the substrate by double exposure.

However, the first partial structure is transferred previously into an oxide layer, for example, by the resist layer or to a silicon layer by the resist layer. The intermediate steps such as, e.g., development and etching are known in the art and are not explained in any further detail here. Afterward, the second test structure is then transferred into a further resist layer above the oxide layer or above the silicon layer or above a product-conforming layer construction.

Figure 1B:
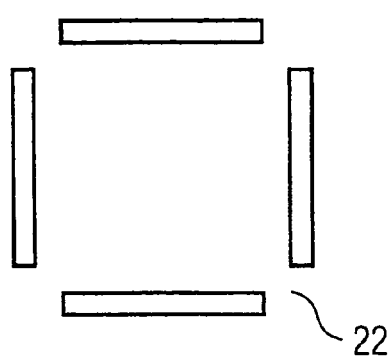
FIG. 1B shows a plan view of a second test structure arrangement which arises through application of an embodiment of the method according to the invention, and FIG. 2 diagrammatically shows a plan view of a mask for application of an embodiment of the method according to the invention.
Figure 1B:
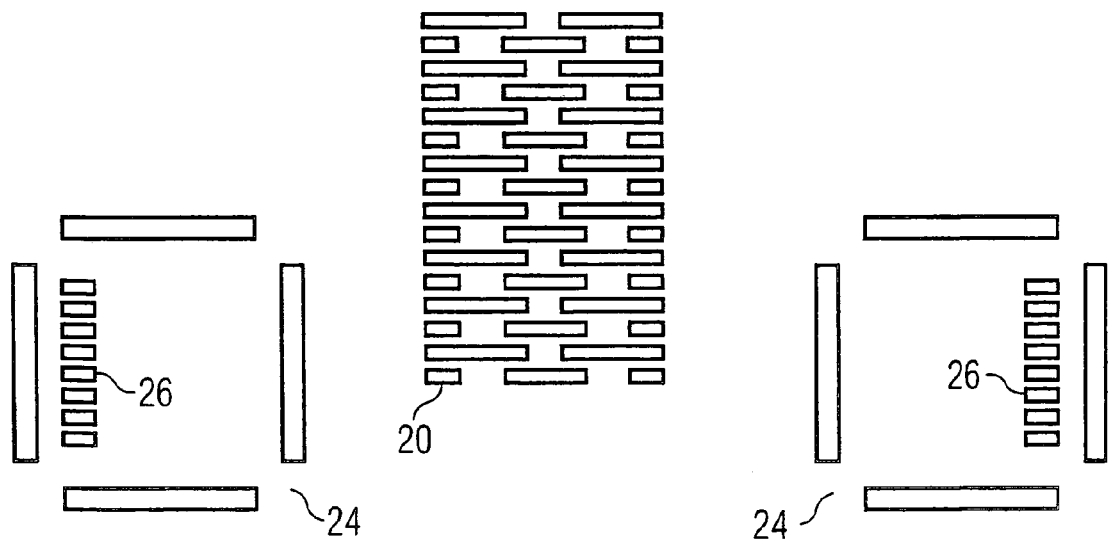
Figure 1B:
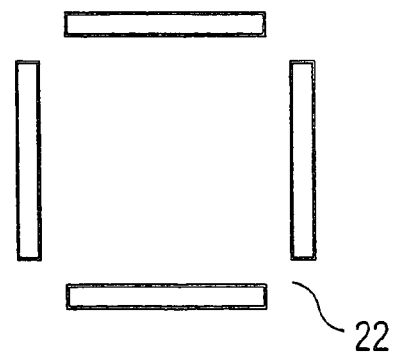

As shown in FIG. 1B, the second test structure has a second circuit pattern 20, a second overlay mark 22, and a second micropatterned alignment mark 24.

In this exemplary embodiment, the circuit pattern 20 of the second partial structure is likewise shown as a structure having elongate structure elements that are required, for example, for fabricating active areas of a random access memory (DRAM). However, the circuit pattern of the first partial structure may also be embodied in the form of a contact hole plane with relatively circular structure elements or as a dense line/gap pattern. Circuit patterns 20 having line widths of 70, 90, or 110 nm are used, for example, in the fabrication of DRAM memory chips.

A second overlay mark 22 is respectively arranged at the upper and lower edge of the test structure. In this example, the overlay marks 22 are an arrangement of elongate bars, i.e., four bars arranged symmetrically about a midpoint. Bars of such overlay marks 22 can have a length of approximately 50 μm to 100 μm and a width of 0.5 μm to 5 μm. In this case, the second overlay mark 22 can be used together with the first overlay mark 12 for determining the overlay accuracy. This can be achieved by arranging the four bar-type structure elements of the second overlay mark 22, in plan view, in a region within the four bar-type structure elements of the first overlay mark 12. This embodiment is known to the person skilled in the art as a box-in-box mark, the relative offset of which can be examined by conventional overlay measuring devices. Due to their size, the bar-type structure elements bring about a high-contrast pattern in an overlay measuring device, which can be detected and measured in a relatively simple manner.

Furthermore, a second micropatterned alignment mark 24 is transferred into the resist layer. The second micropatterned alignment mark 24 includes, for example, an arrangement of elongate bars that are arranged at the upper and lower edge of the test structure and have similar dimensions to the bars of the second overlay mark 22. Further micropatterned elements 26 are arranged within the region enclosed by the four bars. The elements have a pattern that corresponds to the second circuit pattern 20 with regard to the structure widths and structure spacings.

Next, the values of a second positioning error of the second circuit patterns 20 relative to the second overlay marks 22 and the second micropatterned alignment marks 24 are determined for each element of the multiple arrangement of the second partial structure.

A relative positioning error between the first layer and the second layer is subsequently determined from the first positioning error, the second positioning error, and the offset of the first overlay mark 12 and the second overlay mark 22. The relative positioning error has a plurality of contributions that are explained in more detail below.

The first positioning error is determined from the positional inaccuracies of the first circuit patterns 10 relative to the first overlay marks 12. The difference in the positional inaccuracies between the first circuit pattern and the first overlay marks 12 is caused by the different imaging errors or process influences of their differently sized structures. This different imaging error may be determined from the positional inaccuracies of the circuit pattern 10 with respect to the first overlay marks 12. Since the micropatterned elements 16 of the first micropatterned alignment marks 14 have the same imaging error on account of their relatively identical patterning. The different imaging error may also be determined from the positional inaccuracies between the micropatterned elements 16 and the bar-type structures of the first micropatterned alignment marks 14.

The second positioning error is determined from the positional inaccuracies of the second circuit patterns 20 relative to the second overlay marks 22. The difference in the positional inaccuracies between the second circuit pattern 20 and the second overlay marks 22 is caused by the different imaging errors or process influences of their differently sized structures. This different imaging error may be determined from the positional inaccuracies of the circuit pattern 20 with respect to the second overlay marks 22. Since the micropatterned elements 26 of the second micropatterned alignment marks 24 have the same imaging error on account of their relatively identical patterning, the different imaging error may also be determined from the positional inaccuracies between the micropatterned elements 26 and the bar-type structures of the second micropatterned alignment marks 24.

The relative positioning error, which represents the positional accuracy of two layers to be arranged one above the other, may thus be determined from the first positioning error and the second positioning error, taking into account the offset between the first overlay mark 12 and the second overlay mark 22. Since, for example, the bar-type structures of the overlay marks 12, 22 and the micropatterned alignment marks 14, 24 may have the same structure size, no additional imaging errors caused by different structure sizes result due to this procedure.

It is thus possible to determine the extent of alignment for the various layers (which is also referred to as alignment tree) particularly when evaluating a new process line. In particular, it is also possible, by progressively applying the method according to the invention, to examine the influence of different micropatterned alignment marks 14, 24 and overlay marks 12, 22 and to select the marks that are best suited to the process.

The positional accuracies of the different constituent parts of the first test structure and the second test structure are additionally also influenced by the projection apparatus, the exposure mode and the mask unit, which is described in more detail below.

For transferring the first test structure and the second test structure, it is possible, for example, to use a wafer scanner as projection apparatus. Wafer scanners usually have an exposure slot along which the imaging onto the substrate is carried out. In this case, additional imaging errors often result at different positions along the exposure slot. The multiple arrangement of the first test structure and the multiple arrangement of the second test structure are advantageously arranged in column-type fashion, so that, during a transfer of the first test structure and the second test structure into the substrate, it is possible to determine the first positioning errors, the second positioning errors and the relative positioning errors of the test structures along the exposure slot of the projection apparatus. It is thus possible to determine the position-dependent contributions to the positioning errors.

Figure 2:
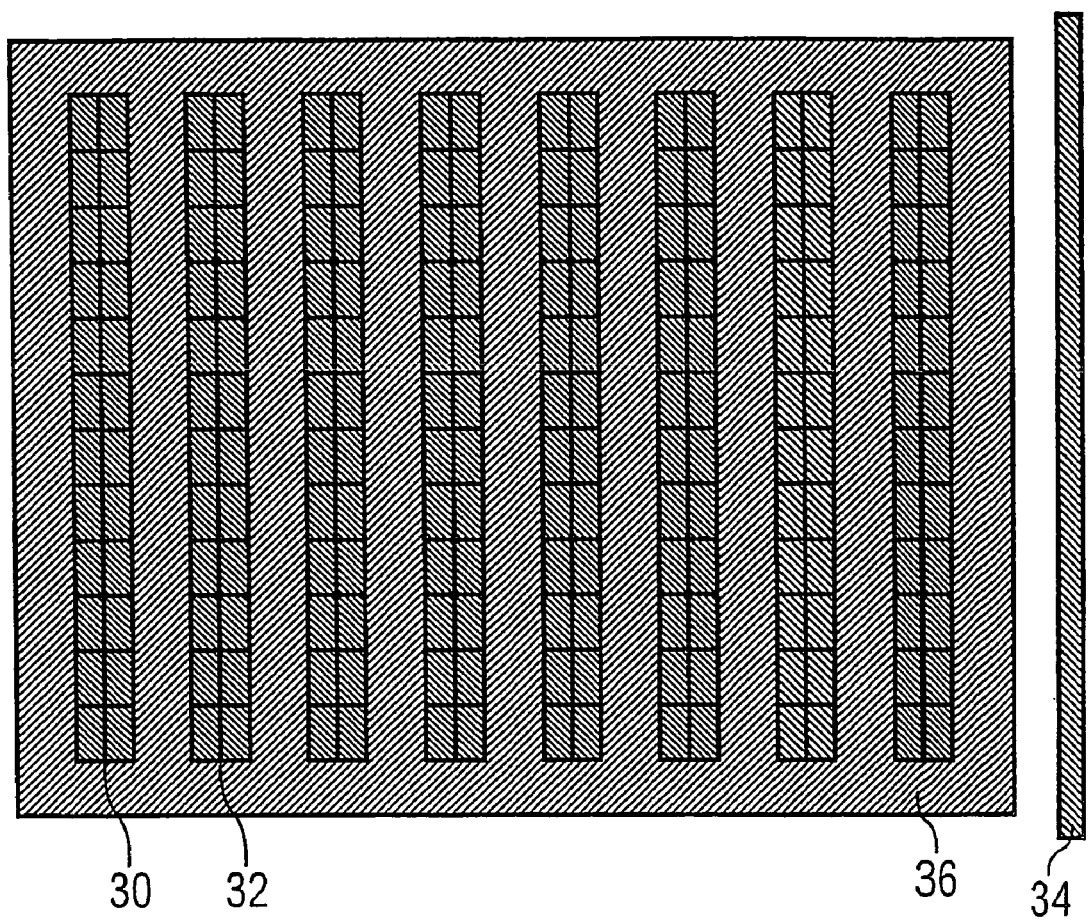

A mask or reticle that is, for instance, suitable for detecting relative positioning errors is shown in FIG. 2. The multiple arrangement of the first test structure 30 and the second test structure 32 are arranged one above the other in column-type fashion, so that a column of the multiple arrangement of the first test structure 30 is located beside a column of the multiple arrangement of the second test structure 32. In terms of its length, which is approximately 22 mm, the mask is adapted to the exposure slot 34 having a length of approximately 20 mm. The mask has a width of 32 mm, so that a plurality of test structures for different planes can be transferred onto the substrate. Multiple arrangements to be exposed one above the other can be separated by chrome coverings 36 on the mask, so that disturbances due to the other test structures on the mask do not occur during the transfer of a layer.

For transferring the first test structure and the second test structure, it is also possible, for example, to use a wafer stepper as projection apparatus. Wafer steppers usually have an imaging region of a lens in which the imaging onto the substrate is carried out. In this case, additional imaging errors often result at different positions in the imaging region of the lens. The multiple arrangement of the first test structure and the multiple arrangement of the second test structure are arranged in matrix-type fashion, so that, during a transfer of the first test structure and the second test structure into the substrate, it is possible to determine the first positioning errors, the second positioning errors, and the relative positioning errors of the test structures in the imaging region of the lens of the projection apparatus. It is thus possible to determine the position-dependent contributions to the positioning errors.

It is also provided within the scope of the invention for a measurement array for scanning electron microscopy to be arranged for an element of the multiple arrangement of the first test structure and/or of the second test structure, it being possible to carry out a measurement of the first positioning error and/or of the second positioning error in said measurement array. As a result, the first positioning errors and/or the second positioning errors can additionally be determined by a scanning electron microscope. This permits an efficient detection of the relative positioning error, which can be determined, for example, by an automatic conditioning of the measurement data of the scanning electron microscope.

The method according to the invention also makes it possible to detect relative positioning errors on the basis of different exposure modes of the projection apparatus. Thus, for example, relative positioning errors may be carried out during the transfer of the layers with the projection apparatus by means of dipole exposure, quadrupole exposure or annular exposure. It is also possible to use different mask types, such as, e.g., an alternating phase mask, a half-tone phase mask, a COG mask, or a CPL mask, which may likewise have an influence on the relative positioning errors.

The method according to the invention enables a flexible detection of the structure-dependent relative positioning errors of circuit patterns under a wide variety of conditions, such as, e.g., different exposure devices, mask types or else the marks themselves. The overlay marks may be embodied in the form of one or a plurality of bars which can be measured optically, for example, in a relatively simple manner due to the high contrast. Since the overlay marks and the circuit patterns are transferred into the same layer of a substrate of a semiconductor wafer, it is possible to determine the positioning errors composed of positional inaccuracy errors of the overlay marks and the circuit patterns, for example, during the evaluation of a new process line, in a manner dependent on different forms used of overlay marks and circuit patterns, but also on different projection apparatuses or masks, over a large region of the substrate.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols
10 First circuit pattern
12 First overlay mark
14 First micropatterned alignment mark
16 Micropatterned elements
20 Second circuit pattern
22 Second overlay mark
24 Second micropatterned alignment mark
26 Further micropatterned elements
30 First test structure
32 Second test structure
34 Exposure slot
36 Chrome covering

We claim:

1. A method for detecting positioning errors of circuit patterns during the transfer by a mask into layers of a substrate of a semiconductor wafer, comprising:
   providing a semiconductor wafer with a substrate;
   transferring at least one multiple arrangement of a first test structure by photolithographic projection into at least one resist layer above the substrate, the first test structure having a first circuit pattern, at least one first overlay mark and at least one first micropatterned alignment mark;
   determining values of a first positioning error of the first circuit pattern relative to the first overlay marks and the first micropatterned alignment marks for each element of the at least one multiple arrangement;
   transferring at least one multiple arrangement of a second test structure by photolithographic projection into at least one resist layer above the substrate, the second test structure having a second circuit pattern, at least one second overlay mark, which can be used together with the first overlay mark for determining the overlay accuracy, and at least one second micropatterned alignment mark;
   determining values of a second positioning error of the second circuit patterns relative to the second overlay marks and the second micropatterned alignment marks for each element of the at least one multiple arrangement;
   determining a relative positioning error of the at least one resist layer from the first positioning error and the second positioning error for each element of the at least one multiple arrangement; and
   determining overlay accuracy within an image field of the projection apparatus as a function of the relative positioning errors determined each element of the at least one multiple arrangement.

2. The method as claimed in claim 1, wherein the at least one multiple arrangement of the first test structure and the at least one multiple arrangement of the first test structure are provided on the photo mask.

3. The method as claimed in claim 1, wherein the multiple arrangement of the first test structure and the multiple arrangement of the second test structure are arranged in column-type fashion to determine the first positioning errors, the second positioning errors, and the relative positioning errors of the test structures along an exposure slot of the projection apparatus during a transfer of the structure into the substrate by a projection apparatus with an exposure slot.

4. The method as claimed in claim 1, wherein the multiple arrangement of the first test structure and the multiple arrangement of the second test structure are arranged in matrix-type fashion to determine the first positioning errors, the second positioning errors, and the relative positioning errors of the test structures in the imaging region of a lens of the projection apparatus during a transfer of the structure into the substrate by a projection apparatus with a lens.

5. The method as claimed in claim 1, wherein the first micropatterned alignment mark is formed with a plurality of microstructure elements, so that the patterning of the first micropatterned alignment mark corresponds to the patterning of the first circuit pattern.

6. The method as claimed in claim 1, wherein the second micropatterned alignment mark is formed with a plurality of microstructure elements, so that the patterning of the second micropatterned alignment mark corresponds to the patterning of the second circuit patterns.

7. The method as claimed in claim 1, wherein the circuit patterns are formed with densely packed structures, semi-densely packed structures, or isolated structures.

8. The method as claimed in claim 1, further comprising:
   a measurement array for scanning electron microscopy arranged for at least one element of the multiple arrangement of the first test structure to measure the first positioning error in the measurement array.

9. The method as claimed in claim 1, further comprising:
   a measurement array for scanning electron microscopy arranged for at least one element of the multiple arrangement of the second test structure to measure the second positioning error in the measurement array.

10. The method as claimed in claim 2, wherein the first test structure and the second test structure are transferred into the same resist layer on the substrate by double exposure.

11. The method as claimed in claim 1, wherein the first test structure is transferred into an oxide layer by the at least one resist layer.

12. The method as claimed in claim 11, wherein the second test structure is transferred into a resist layer above the oxide layer.

13. The method as claimed in claim 1, wherein the first test structure is transferred into a silicon layer by the at least one resist layer.

14. The method as claimed in claim 13, wherein the second test structure is transferred into a resist layer above the silicon layer.

15. The method as claimed in claim 1, wherein the mask in the projection apparatus is transferred by dipole exposure, quadrupole exposure, or annular exposure.

16. The method as claimed in claim 1, wherein the mask in the projection apparatus is transferred by single exposure or multiple exposure.

17. The method as claimed in claim 1, wherein the mask is at least one of an alternating phase mask, a halftone phase mask, a COG mask, or a CPL mask.

* * * * *